United States Patent
Kim

(10) Patent No.: US 9,510,455 B2
(45) Date of Patent: Nov. 29, 2016

(54) ELECTRONIC COMPONENT EMBEDDED SUBSTRATE AND MANUFACTURING METHOD THEREOF

(71) Applicant: SAMSUNG ELECTRO-MECHANICS CO., LTD., Suwon-si, Gyeonggi-do (KR)

(72) Inventor: Bong-Soo Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 125 days.

(21) Appl. No.: 14/219,768

(22) Filed: Mar. 19, 2014

(65) Prior Publication Data

US 2015/0144386 A1 May 28, 2015

(51) Int. Cl.
*H05K 1/18* (2006.01)
*H05K 3/46* (2006.01)

(52) U.S. Cl.
CPC ............. *H05K 1/186* (2013.01); *H05K 3/4673* (2013.01); *H05K 2201/10393* (2013.01); *Y10T 29/49139* (2015.01)

(58) Field of Classification Search
CPC ................... H05K 1/181–1/184; H05K 3/10; H05K 3/306; H05K 3/4038; H05K 2201/10598

USPC ......................................................... 361/761
See application file for complete search history.

(56) References Cited

U.S. PATENT DOCUMENTS

| | | | | |
|---|---|---|---|---|
| 5,606,198 A | * | 2/1997 | Ono ................. H01L 23/53223 257/666 |
| 5,994,648 A | * | 11/1999 | Glovatsky .............. H05K 1/183 174/254 |
| 7,876,577 B2 | * | 1/2011 | Weber ..................... H05K 1/183 174/260 |
| 2013/0048361 A1 | * | 2/2013 | Yamashita ........ H01L 23/49822 174/260 |
| 2014/0104797 A1 | * | 4/2014 | Machida ................ H05K 1/181 361/760 |
| 2014/0118976 A1 | * | 5/2014 | Yoshikawa ....... H01L 23/49822 361/763 |
| 2014/0153204 A1 | * | 6/2014 | Kim ....................... H05K 3/321 361/762 |

* cited by examiner

*Primary Examiner* — Hoa C Nguyen
(74) *Attorney, Agent, or Firm* — NSIP Law

(57) ABSTRACT

The present invention discloses an electronic component embedded substrate and a manufacturing method thereof. The electronic component embedded substrate in accordance with an embodiment of the present invention includes: a core board having a cavity formed therein; an electronic component being embedded in the cavity; and a circuit pattern formed on one surface of the core board and configured for fixing the electronic component in the cavity by pressing the electronic component.

13 Claims, 2 Drawing Sheets

ELECTRONIC COMPONENT EMBEDDED SUBSTRATE AND MANUFACTURING METHOD THEREOF

CROSS-REFERENCE TO RELATED APPLICATIONS

This application claims the benefit of Korean Patent Application No. 10-2013-0146602, filed with the Korean Intellectual Property Office on Nov. 28, 2013, the disclosure of which is incorporated herein by reference in its entirety.

BACKGROUND

1. Technical Field

The present invention relates to an electronic component embedded substrate and a method of manufacturing the electronic component embedded substrate.

2. Background Art

As electronic products become increasingly smaller, there have been increasing demands for more integrated and thinner circuit boards installed in these electronic products. In line with these demands, there has been an increasing need recently for printed circuit boards in which electronic components are embedded.

The electronic component embedded printed circuit board is formed through an embedding process, in which, after a cavity is formed in a core board, an electronic component is placed in the cavity and fixed in the cavity using, for example, a filler. By using the printed circuit board fabricated using this embedding process, a smaller and more integrated printed circuit board can be realized because the electronic component can be embedded therein.

However, the conventional electronic component embedded printed circuit boards used adhesive tape to fix the electronic component in the cavity, thereby increasing the manufacturing cost and complicating the fabricating process due to the introduction of attaching and detaching procedures of the adhesive tape.

The related art of the present invention is disclosed in Korea Patent 10-0832653.

SUMMARY

The present invention provides an electronic component embedded substrate and a manufacturing method thereof that can fasten the electronic component using a circuit pattern.

An aspect of the present invention provides an electronic component embedded substrate, which includes: a core board having a cavity formed therein; an electronic component being embedded in the cavity; and a circuit pattern formed on one surface of the core board and configured for fixing the electronic component in the cavity by pressing the electronic component.

The circuit pattern can include at least a pair of support patterns extended from the circuit pattern and arranged opposite to each other and configured to fix the electronic component in the cavity by pressing lateral surfaces of the electronic component.

The support patterns can be protruded toward the cavity at either upper lateral surface of the cavity to press the electronic component.

The support patterns can be formed to have a vertical cross-section thereof that is bent as a curved surface.

The circuit pattern can include: at least a pair of first support patterns extended from the circuit pattern and arranged opposite to each other and configured to press lateral surfaces of the electronic component; and at least a pair of second support patterns arranged opposite to each other in an orthogonal direction to an extended direction of the first support patterns.

The first support patterns and the second support patterns can each be formed to have a vertical cross-section thereof that is bent as a curved surface.

Another aspect of the present invention provides a method of manufacturing an electronic component embedded substrate, which includes: forming support patterns and a first circuit pattern on one surface of a core board corresponding to a position where an electronic component is to be embedded, the support patterns being configured for pressing and supporting the electronic component; forming a cavity by removing a portion of the core board corresponding to the position where the electronic component is to be embedded; embedding the electronic component in the cavity by inserting the electronic component in between the support patterns from above the cavity; and laminating an insulation layer on at least one surface of the core board.

In the forming of the support patterns and the first circuit pattern, the support patterns and the first circuit pattern can be formed by laminating a metal layer on one surface of the core board and patterning the metal layer laminated on the core board corresponding to the position where the electronic component is to be embedded.

In the step of forming the cavity, a portion of the core board can be removed by emitting laser on the other surface of the core board corresponding to the position where the electronic component is to be embedded.

The method of manufacturing an electronic component embedded substrate can also include: forming a via hole configured for being connected with the first circuit pattern or the electronic component; and forming a second circuit pattern on the insulation layer, the second circuit pattern being connected with the via hole.

DETAILED DESCRIPTION

Figure 1:
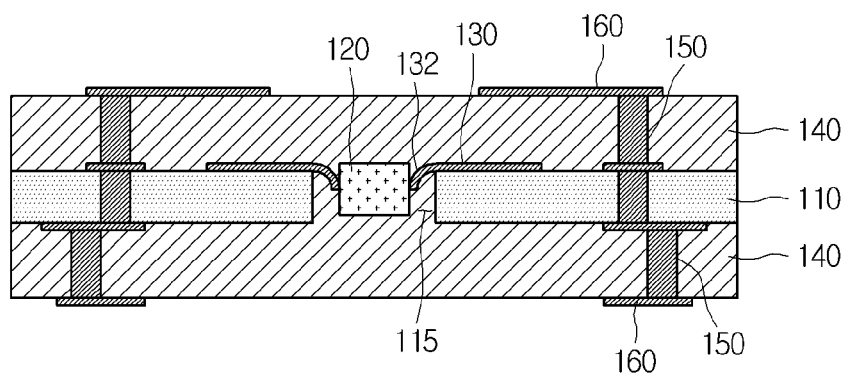
FIG. 1 is a cross-sectional view showing a structure of an electronic component embedded substrate in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, certain embodiments of an electronic component embedded substrate and a manufacturing method thereof will be described in detail with reference to the accompanying drawings. In describing certain embodiments of the present invention with reference to the accompanying drawings, any identical or corresponding elements will be assigned with same reference numerals, and their redundant description will not be provided.

FIG. 1 is a cross-sectional view showing a structure of an electronic component embedded substrate in accordance with an embodiment of the present invention.

Referring to FIG. 1, the electronic component embedded substrate in accordance with an embodiment of the present invention includes a core board 110, an electronic component 120, a first circuit pattern 130, a support pattern 132, a via hole 150 and a second circuit pattern 160.

The core board 110 includes a cavity 115, which is formed by perforating a portion of an insulating resin layer. Here, the core board 110 can be made of a reinforcement material and resin. Moreover, the cavity 115 can be formed in an area corresponding to that of the electronic component 120 or in a greater area than the electronic component 120 in order to have the electronic component 120 embedded therein.

The electronic component 120 can be electrically connected with an outside and perform a predetermined function. In the electronic component embedded substrate in accordance with an embodiment of the present invention, the electronic component 120 can be a multi-layer ceramic capacitor that includes a capacitor body 122 and an electrode 124. However, the present invention is not restricted to what is described herein, various kinds of products can be used as the electronic component 120.

The first circuit pattern 130 can be formed as a pattern that is preconfigured on at least one surface of the core board 110 in order to transmit electric signals. Here, the first circuit pattern 130 can be made of a conductive material that has a good electric conductivity. The first circuit pattern 130 can include the support pattern 132 that fixes the electronic component 120 in the cavity 115.

The support pattern 132 will be described in more detail with reference to FIG. 2.

Figure 2:
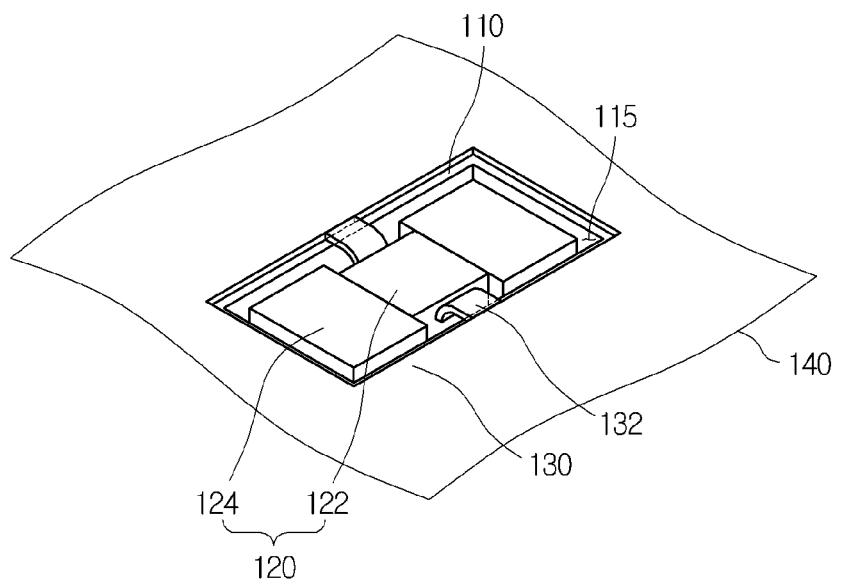
FIG. 2 shows an internal structure of the electronic component embedded substrate shown in FIG. 2.

FIG. 2 shows an internal structure of the electronic component embedded substrate shown in FIG. 2.

Referring to FIG. 2, the support pattern 132 can press the electronic component 120 and position the electronic component 120 in the cavity 115. Here, the support pattern 132 can be formed in at least a pair in order to press the electronic component 120 from either lateral side of the cavity 115. The support pattern 132 can be formed as a part of the first circuit pattern 130. The support pattern 132 can be connected with the first circuit pattern 130, and the pair of support patterns 132 can be arranged opposite to each other. In other words, the pair of support patterns 132 can be extended from the first circuit pattern 130 so as to be protruded toward the cavity 115 at either upper lateral surface of the cavity 115.

The support pattern 132 can be formed to be bent as a curved surface. The support pattern 132 can be formed to have a curved vertical cross-section thereof so as to make contact with a lateral surface of the electronic component 120 and support the electronic component 120. Here, the support pattern 132 can support the electronic component 120 by being in contact with the capacitor body 122. Moreover, the support pattern 132 can support the electronic component 120 by being in contact with other portion of the electronic component 120 than the capacitor body 122.

The support pattern 132 can be formed to have a predetermined tension in order to support the electronic component 120. For this, the support pattern 132 can be formed with a conductive material having a predetermined tension or formed in a predetermined size. Here, the support pattern 132 can be formed with a same conductive material as the first circuit pattern 130.

Referring to FIG. 1 again, the core board 110 can have an insulation layer 140 laminated on at least one surface thereof. Here, the insulation layer 140 can protect the electronic component 120 by filling in the cavity 115. The insulation layer can surround the electronic component 120 in the cavity 115 and fix a position of the electronic component 120. The insulation layer 140 can be made of an insulating material, for example, prepreg.

The via hole 15 can electrically connect the first circuit pattern 130 with the second circuit pattern 160. Here, the via hole 150 can penetrate through the insulation layer 140 to connect the first circuit pattern 130 with the second circuit pattern 160. Moreover, the via hole 150 can electrically connect the electronic component 120 with the second circuit pattern 160.

The second circuit pattern 160 can be electrically connected with an outside and transfer electrical signals to the first circuit pattern 130. For this, the second circuit pattern 160 can be formed on the insulation layer 140.

Figure 3:
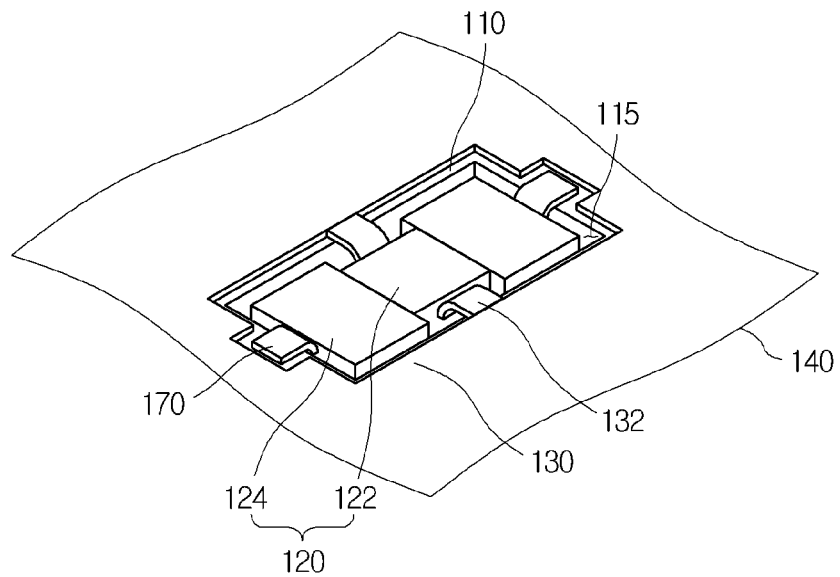
FIG. 3 shows an internal structure of an electronic component embedded substrate in accordance with another embodiment of the present invention.

FIG. 3 shows an internal structure of an electronic component embedded substrate in accordance with another embodiment of the present invention.

Referring to FIG. 3, the electronic component embedded substrate in accordance with another embodiment of the present invention includes a first support pattern 132 and a second support pattern 170 configured for supporting an electronic component 120.

Any description made for the electronic component embedded substrate with reference to FIGS. 1 and 2 will not be repeated herein.

The first support pattern 132 can be formed as a part of a first circuit pattern 130. Moreover, a pair of first support patterns 132 can be arranged opposite to each other and extended from the first circuit pattern 130. The pair of first support patterns 130 can be formed to be protruded toward the cavity 115 at either lateral surface of a cavity 115.

The first support pattern 132 can be formed to be bent as a curved surface. The first support pattern 132 can be formed to have a curved vertical cross-section thereof so as to make contact with a lateral surface of the electronic component 120 and support the electronic component 120. Here, the first support pattern 132 can support the electronic component 120 by being in contact with a capacitor body 122 of the electronic component 132.

A pair of second support patterns 170 can be formed opposite to each other in an orthogonal direction to an extended direction of the first support pattern 132. Here, the second support pattern 170 can be formed to be separated from the first circuit pattern 130. The second support pattern 170 can be formed to be protruded toward the cavity at either lateral surface in the front and back of the cavity 115.

The second support pattern 170 can be formed to be bent as a curved surface. The second support pattern 170 can be formed to have a curved vertical cross-section thereof so as to make contact with a lateral surface of the electronic component 120 and support the electronic component 120. Here, the second support pattern 170 can support the electronic component 120 by being in contact with a terminal 124 of the electronic component 132. The second support pattern 170 can support the electronic component 120 without electrically connecting the terminal 124 to the first circuit pattern 130.

The first support pattern 132 and the second support pattern 170 can fix the electronic component 120 securely by pressing and supporting the electronic component 120 at 4 locations.

Figure 4:
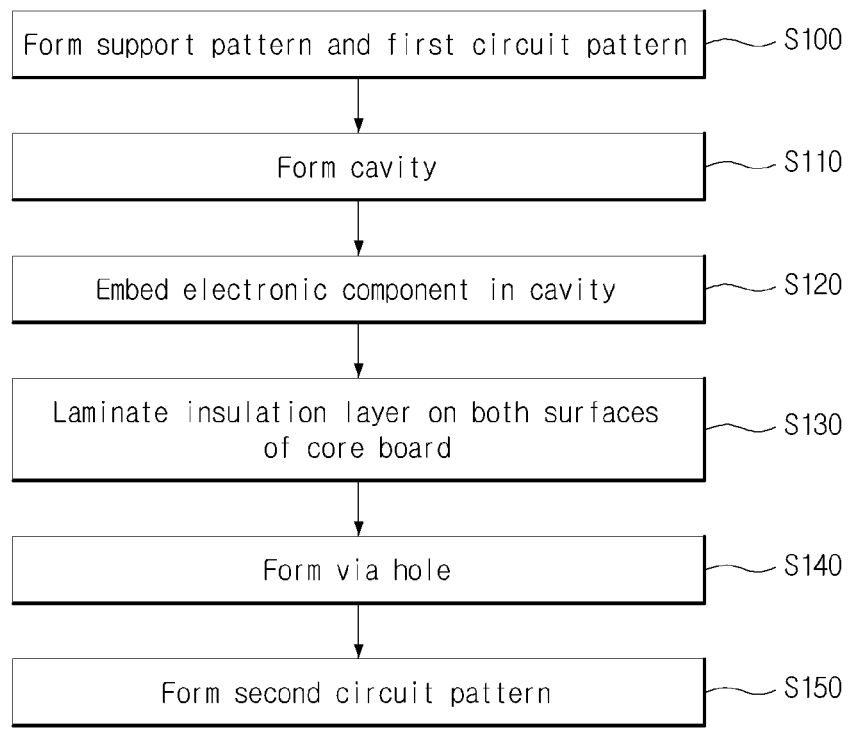
FIG. 4 shows a method of manufacturing an electronic component embedded substrate in accordance with an embodiment of the present invention.

FIG. 4 shows a method of manufacturing an electronic component embedded substrate in accordance with an embodiment of the present invention.

The method of manufacturing an electronic component embedded substrate in accordance with an embodiment of the present invention includes: forming support patterns, which are for pressing and supporting an electronic component, and a first circuit pattern on one surface of a core board corresponding to a position where the electronic component is to be embedded (S100); forming a cavity by removing a portion of the core board corresponding to the position where the electronic component is to be embedded (S110); embedding the electronic component in the cavity (S120); laminating an insulation layer on both surfaces of the core board (S130); forming a via hole configured for being connected with the first circuit pattern or the electronic component (S140); and forming a second circuit pattern, which is connected with the via hole, on the insulation layer (S150).

In step S100, a metal layer can be laminated on one surface of the core board. Thereafter, the support patterns and the first circuit pattern can be formed by patterning the metal layer laminated on the core board corresponding to the position where the electronic component is to be embedded. Here, the support patterns can be a part of the first circuit pattern, and a pair thereof can be extended from the first circuit pattern and arranged opposite to each other.

The first circuit pattern can be formed by a variety of methods, for example, the subtractive method, which removes a portion of the metal layer selectively, the additive method, which additionally forms a wiring pattern on an insulation substrate by use of electroless plating and electroplating, and the inkjet method, which uses conductive ink on an insulation layer. Moreover, the metal layer can be a thin-film type of conductive material. For example, the metal layer can be a copper foil.

In step S110, the cavity can be formed by laser drilling in the core board corresponding to the position where the electronic component is to be embedded. Here, the laser drilling can remove a portion of the core board by emitting laser on the other surface of the core board. Through this, the cavity can be formed in the core board in such a way that a pair of support patterns are protruded at either lateral surface thereof.

In step S120, the electronic component can be inserted in between the support patterns from above the cavity. The electronic component can be fixed in the cavity by being pressed by the support patterns.

In step S130, the insulation layer can be laminated on at least one surface of the core board. Here, the insulation layer can be filled in the cavity of the core board. By filling the insulation layer in the cavity, the electronic component fixed in the cavity can be secured by surrounding the electronic component with an insulating material.

In step S140, the via hole connected with the first circuit pattern or the electronic component can be formed by penetrating the insulation layer.

In step S150, the second circuit pattern connected with the via hole can be formed by laminating the metal layer on the insulation layer and then patterning the metal layer.

With the method of manufacturing an electronic component embedded substrate in accordance with an embodiment of the present invention, a process of fixing the electronic component with adhesive tape can be omitted, and thus the manufacturing process can be easily managed and the productivity can be improved.

Although certain embodiments of the present invention have been described, it shall be appreciated that there can be a very large number of permutations and modification of the present invention by those who are ordinarily skilled in the art to which the present invention pertains without departing from the technical ideas and boundaries of the present invention, which shall be defined by the claims appended below.

It shall be also appreciated that many other embodiments other than the embodiments described above are included in the claims of the present invention.

What is claimed is:

1. An electronic component embedded substrate comprising:
    a core board having a cavity formed therein;
    an electronic component, having a body and an electrical terminal, embedded in the cavity; and
    a circuit pattern formed on one surface of the core board and configured for fixing the electronic component in the cavity by pressing the body of the electronic component,
    wherein the cavity has lateral surfaces and formed through the core board, and
    wherein the circuit pattern is not in contact with the lateral surfaces of the cavity.

2. The electronic component embedded substrate of claim 1, wherein the circuit pattern comprises at least a pair of support patterns extended from the circuit pattern and arranged opposite to each other and configured to fix the electronic component in the cavity by pressing lateral surfaces of the body of the electronic component.

3. The electronic component embedded substrate of claim 2, wherein the support patterns are protruded toward the cavity at either upper lateral surface of the cavity to press against the body of the electronic component.

4. The electronic component embedded substrate of claim 3, wherein the support patterns are formed to have respective vertical cross-sections that are bent as curved surfaces.

5. An electronic component embedded substrate comprising:
    a core board having a cavity formed therein;
    an electronic component embedded in the cavity;
    a circuit pattern formed on one surface of the core board; and
    a support pattern formed on the one surface and configured to support the electronic component for fixing the electronic component in the cavity, wherein the electronic component and the support pattern are configured to not be connected electrically wherein the cavity has lateral surfaces and formed through the core board, and wherein the support pattern is not in contact with the lateral surfaces of the cavity.

6. The electronic component embedded substrate of claim 5, wherein the electronic component comprises a body and an electrical terminal, and wherein the support pattern is configured for fixing the electronic component in the cavity by pressing the body of the electronic component.

7. The electronic component embedded substrate of claim 6, wherein the support pattern is part of and extended from the circuit pattern.

8. The electronic component embedded substrate of claim 5, wherein the electronic component comprises a body and an electrical terminal, and wherein the support pattern is configured for fixing the electronic component in the cavity by pressing the electrical terminal of the electronic component.

9. The electronic component embedded substrate of claim 8, wherein the support pattern is not connected with the circuit pattern.

10. The electronic component embedded substrate of claim 5, wherein the support pattern comprises at least two patterns that are protruded toward the cavity at different upper lateral surfaces of the cavity to press against the electronic component to fix the electronic component in the cavity.

11. The electronic component embedded substrate of claim 5, wherein the support pattern comprises at least two patterns that are formed to have respective vertical cross-sections that are bent as curved surfaces to apply respective pressing forces against the electronic component to fix the electronic component in the cavity.

12. The electronic component embedded substrate of claim 5, wherein the circuit pattern and the support pattern are formed of a same conducting material.

13. An electronic component embedded substrate comprising:

a core board having a cavity formed therein;

an electronic component, having a body and an electrical terminal, embedded in the cavity;

a first circuit pattern formed on opposing surfaces of the core board, the first circuit pattern on one of the surfaces being configured for fixing the electronic component in the cavity by pressing the body of the electronic component;

an insulation layer formed on the first circuit patterns; and a second circuit pattern formed on outer surfaces of the insulation layers, the second circuit patterns being electrically coupled to the first circuit patterns through via holes formed in the insulation layers and the core board, wherein the cavity has lateral surfaces and formed through the core board, and wherein the first circuit pattern on one of the surfaces is not in contact with the lateral surfaces of the cavity.

\* \* \* \* \*